US009978502B2

(12) United States Patent
Gouchi

(10) Patent No.: US 9,978,502 B2
(45) Date of Patent: May 22, 2018

(54) MULTILAYER SUBSTRATE

(71) Applicant: Murata Manufacturing Co., Ltd., Nagaokakyo-shi, Kyoto-fu (JP)

(72) Inventor: Naoki Gouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/486,340

(22) Filed: Apr. 13, 2017

(65) Prior Publication Data

US 2017/0316866 A1 Nov. 2, 2017

(30) Foreign Application Priority Data

Apr. 28, 2016 (JP) ................................ 2016-090120

(51) Int. Cl.
*H01F 5/00* (2006.01)
*H01F 27/24* (2006.01)
*H01F 27/28* (2006.01)
*H01L 27/08* (2006.01)

(52) U.S. Cl.
CPC . *H01F 27/2804* (2013.01); *H01F 2027/2809* (2013.01)

(58) Field of Classification Search
USPC ........... 336/200, 233, 83, 192; 257/531, 547
See application file for complete search history.

(56) References Cited

U.S. PATENT DOCUMENTS

2002/0075116 A1* 6/2002 Peels .................. H01F 17/0013 336/200
2016/0012950 A1* 1/2016 Nishino .................. G03B 5/00 359/814
2016/0055967 A1 2/2016 Nishino et al.

FOREIGN PATENT DOCUMENTS

WO 2015/129601 A1 9/2015

* cited by examiner

*Primary Examiner* — Elvin G Enad
*Assistant Examiner* — Kazi Hossain
(74) *Attorney, Agent, or Firm* — Keating & Bennett, LLP

(57) ABSTRACT

A multilayer substrate includes a stacked body including thermoplastic resin insulating base material layers, a coil, and a first low flow member and a second low flow member including a flowability lower than the flowability of the thermoplastic resin at a temperature during heating and pressurizing. The coil includes linear conductors that are each provided on the insulating base material layers and include a first region surrounded by the linear conductors when viewed in a stacking direction (Z-axis direction) of the insulating base material layers. The first low flow member including a planar or substantially planar shape and the second low flow member including a winding shape, when viewed in the Z-axis direction, are arranged in the first region. The first low flow member, when viewed in the Z-axis direction, at least partially overlaps a second region surrounded by the second low flow member.

20 Claims, 11 Drawing Sheets

MULTILAYER SUBSTRATE

CROSS REFERENCE TO RELATED APPLICATIONS

This application claims the benefit of priority to Japanese Patent Application No. 2016-090120 filed on Apr. 28, 2016. The entire contents of this application are hereby incorporated herein by reference.

BACKGROUND OF THE INVENTION

1. Field of the Invention

The present invention relates to a multilayer substrate, and more particularly to a multilayer substrate including a coil provided in a stacked body.

2. Description of the Related Art

Conventionally, a multilayer substrate that is formed by heating and pressurizing a plurality of base materials made of thermoplastic resin and provided with a helical shaped coil configured by a winding shaped linear conductor and an interlayer connection conductor each of which is provided in contact with each of the plurality of base materials, has been known.

For example, International Publication No. 2015/129601 discloses a multilayer substrate provided with a member having flowability lower than the flowability of thermoplastic resin (hereinafter referred to as a “low flow member”) at a temperature during heating and pressurizing of a plurality of base materials and also provided with a structure in which the low flow member is formed in a region surrounded by a winding shaped linear conductor. Although, in general, the flow of a base material is great near a linear conductor in a coil opening during heating and pressurizing, in the above configuration, the flow of the base material near the linear conductor in the coil opening is excessively reduced or prevented by the low flow member such that movement, deformation, or the like of the linear conductor caused by the flow of the base material into the coil opening during heating and pressurizing is reduced or prevented.

Accordingly, this configuration somewhat stabilizes the shape of a coil and provides a multilayer substrate having a structure provided with a coil with somewhat reduced variations in electrical characteristics and somewhat increased electric reliability.

However, in the structure disclosed in International Publication No. 2015/129601, the low flow member is formed almost entirely in a region (coil opening) surrounded by the winding shaped linear conductor, which results in the low flow member being densely arranged in the coil opening. Thus, the flow of the base material into the coil opening during heating and pressurizing is excessively reduced or prevented, the thickness of the coil opening portion becomes excessively large compared to the thickness of other portions of the multilayer substrate after heating and pressurizing, which significantly reduces the flatness of the multilayer substrate.

SUMMARY OF THE INVENTION

In view of the foregoing, preferred embodiments of the present invention provide, with a simple configuration, a flat or substantially flat multilayer substrate that includes a coil with significantly reduced variations in electrical characteristics and significantly increased electric reliability.

A multilayer substrate according to a preferred embodiment of the present invention includes a stacked body including a plurality of insulating base material layers made of thermoplastic resin; a coil that is provided in contact with the stacked body and includes a winding axis in or substantially in a stacking direction of the plurality of insulating base material layers; and a first low flow member and a second low flow member provided in contact with the stacked body and include a flowability lower than a flowability of the thermoplastic resin at a temperature during heating and pressurizing of the thermoplastic resin; the coil includes a plurality of linear conductors that are provided on different layers of the plurality of insulating base material layers, the coil includes a first region surrounded by the plurality of linear conductors when viewed in the stacking direction of the plurality of insulating base material layers; the first low flow member and the second low flow member are each provided on one of the plurality of insulating base material layers; and at least a portion of the first low flow member and at least a portion of the second low flow member are arranged within the first region when viewed in the stacking direction of the plurality of insulating base material layers; the second low flow member includes a winding shape when viewed in the stacking direction of the plurality of insulating base material layers; and the first low flow member, when viewed in the stacking direction of the plurality of insulating base material layers, includes a planar or substantially planar shape and at least partially overlaps a second region surrounded by the second low flow member.

With this configuration, when viewed in the stacking direction of the plurality of insulating base material layers, the low flow member (the first low flow member and the second low flow member) is provided in the opening of the coil such that excessive flow of the insulating base material layers into the opening of the coil during heating and pressurizing is significantly reduced or prevented. Therefore, movement, deformation, or the like of the linear conductor caused by the flow of the insulating base material layers during heating and pressurizing is significantly reduced or prevented. Accordingly, this configuration maintains or substantially maintains the shape of a coil after heating and pressurizing. Thus, a multilayer substrate including a coil with significantly reduced variations in electrical characteristics and significantly increased electric reliability is provided.

In addition, at least a portion of the first low flow member overlaps a second region (opening) surrounded by the second low flow member, and the second low flow member includes a winding shape that includes an area smaller than the area of the first low flow member with a planar or substantially planar shape. Accordingly, this configuration provides a multilayer substrate that is flat or substantially flat without excessively reducing or preventing the flow of the insulating base material layers into the first region during heating and pressurizing.

The first low flow member or the second low flow member is preferably provided on an insulating base material layer that includes at least one linear conductor among the plurality of linear conductors thereon. With this configuration, in comparison to the first low flow member (or the second low flow member) and the linear conductor being provided on different insulating base material layers, the distance between the first low flow member (or the second low flow member) and the linear conductor is significantly reduced. Therefore, the effect of reducing the flow of the insulating base material layers by the first low flow member (or the second low flow member) during heating and pressurizing is significantly improved.

The second low flow member may include a plurality of second low flow members.

The first low flow member may include a plurality of first low flow members.

The first low flow member and the second low flow member are preferably made of the same material as the plurality of linear conductors. In this configuration, the linear conductor, the first low flow member, and the second low flow member are able to be formed in the same (one) process, which significantly simplifies the manufacturing process.

Moreover, in this configuration, the first low flow member and the second low flow member include the same conductor material as the plurality of linear conductors, and the first low flow member provided as a conductor including a planar shape overlaps the second region (opening) of the second low flow member such that losses caused by interlinking magnetic flux generated in the coil with the second low flow member that is provided as a conductor including a winding (annular or substantially annular) shape are significantly reduced or prevented.

The first low flow member and the second low flow member are preferably made of the same material as the plurality of linear conductors; and the plurality of first low flow members may preferably be arranged so as to interpose the second low flow member in the stacking direction of the plurality of insulating base material layers. In this configuration, losses caused by interlinking magnetic flux generated in the coil with the second low flow member that is provided as a conductor including a winding shape are significantly reduced or prevented.

The multilayer substrate may further include a third low flow member and a fourth low flow member that are provided in contact with the stacked body and have a flowability lower than the flowability of the thermoplastic resin at the temperature during heating and pressurizing the thermoplastic resin; the third low flow member and the fourth low flow member are each provided on one of the plurality of insulating base material layers and, when viewed in the stacking direction of the plurality of insulating base material layers, are arranged outside of the first region and at a position that does not overlap the plurality of linear conductors; the fourth low flow member includes a winding shape when viewed in the stacking direction of the plurality of insulating base material layers; and the third low flow member, when viewed in the stacking direction of the plurality of insulating base material layers, includes a planar shape and at least partially overlaps a third region surrounded by the fourth low flow member.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
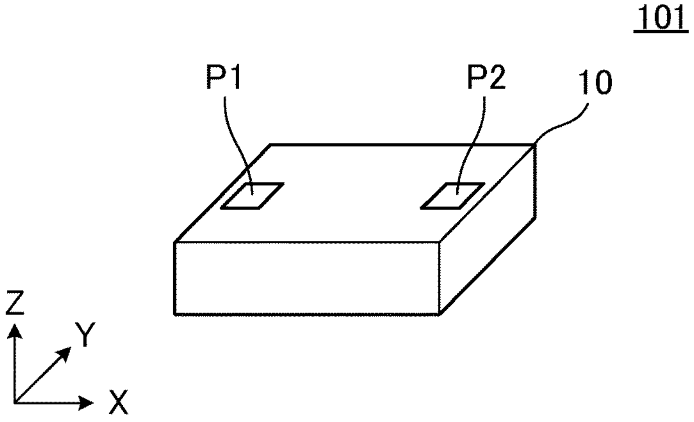
FIG. 1A is a perspective view of a multilayer substrate 101 according to a first preferred embodiment of the present invention.

Hereinafter, a plurality of preferred embodiments of the present invention will be described with reference to the drawings and several specific examples. In the drawings, components and elements assigned with the same reference numerals or symbols will represent identical components and elements. While preferred embodiments of the present invention are divided and described for the sake of convenience in consideration of ease of description or understanding of main points, constituent elements described in different preferred embodiments are able to be partially replaced and combined with each other. In second and subsequent preferred embodiments, a description of matters common to the first preferred embodiment will be omitted and only different points are described. In particular, the same functions and effects by the same configuration will not be described one by one for each preferred embodiment.

First Preferred Embodiment

Figure 1B:
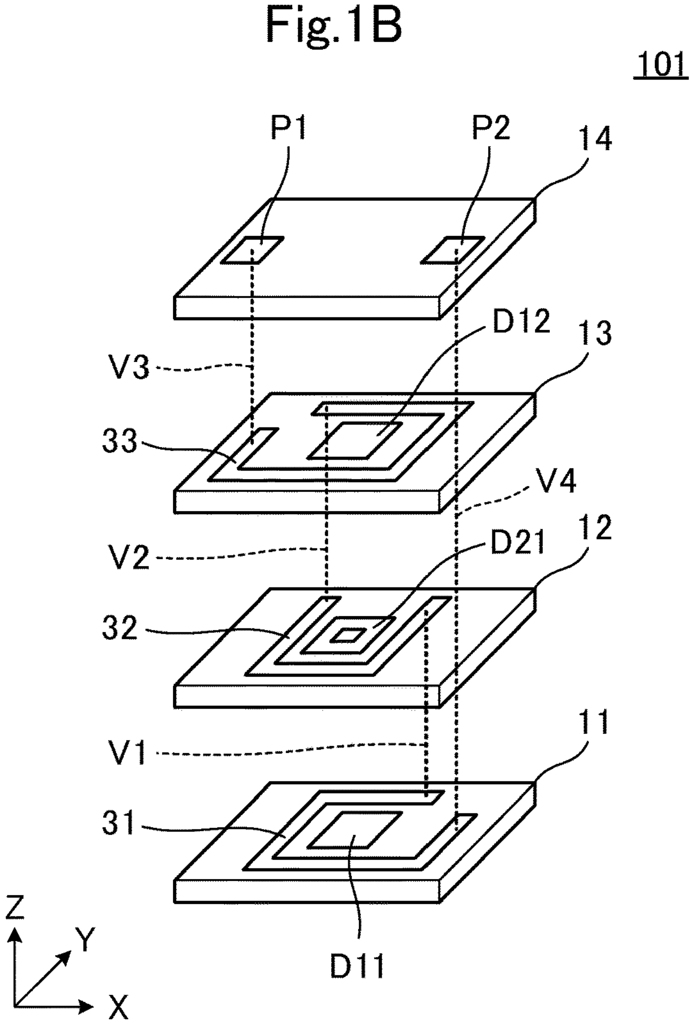
FIG. 1B is an exploded perspective view of the multilayer substrate 101.
Figure 2A:
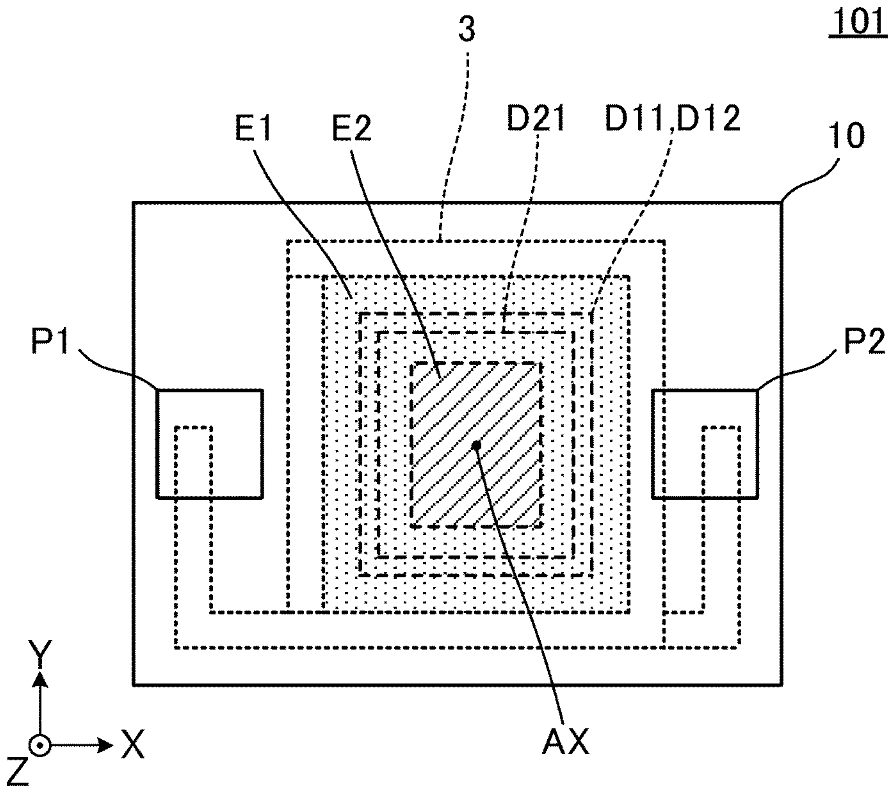
FIG. 2A is a plan view of the multilayer substrate 101.
Figure 2B:
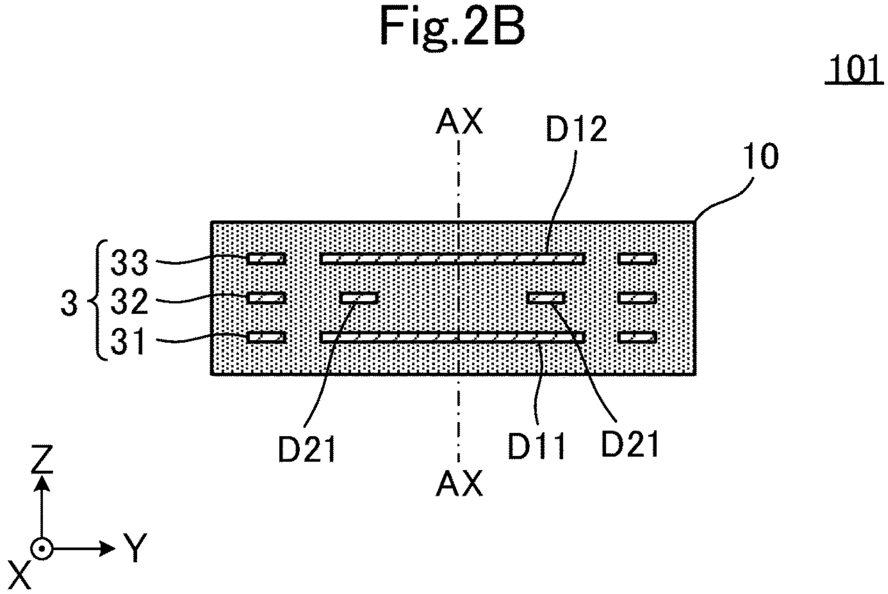
FIG. 2B is a cross-sectional view of the multilayer substrate 101.

FIG. 1A is a perspective view of a multilayer substrate 101 according to a first preferred embodiment of the present invention, and FIG. 1B is an exploded perspective view of the multilayer substrate 101. FIG. 2A is a plan view of the multilayer substrate 101, and FIG. 2B is a cross-sectional view of the multilayer substrate 101. In FIG. 2A, in order to make the structure more understandable, a coil 3 is indicated by a dashed line. In addition, in FIG. 2A, in order to make the structure more understandable, a first region E1 is indicated by a dot pattern and a second region E2 is indicated by hatching. The same may be applied to a plan view in each of the following preferred embodiments.

The multilayer substrate 101 includes a stacked body 10, and a coil 3 (to be described in detail later), and two first low flow members D11 and D12 and a second low flow member D21 that are each in contact with the stacked body 10. As illustrated in FIG. 2B, the two first low flow members D11 and D12 and the second low flow member D21 are inside of the stacked body 10.

The stacked body 10 preferably includes a rectangular or substantially rectangular parallelepiped shape that is made of thermoplastic resin and includes a longitudinal direction that coincides with the X-axis direction. The stacked body 10, as illustrated in FIG. 1B, preferably is formed by heating and pressurizing a plurality of insulating base material layers 11, 12, 13, and 14 that are made of thermoplastic resin. The plurality of insulating base material layers 11, 12, 13, and 14 are each provided as a plate that includes a rectangular or substantially rectangular shape and a longitudinal direction that coincides with the X-axis direction. The plurality of insulating base material layers 11, 12, 13, and 14 are sheets that are made of a liquid crystal polymer, for example, as a principal material.

A linear conductor 31 and the first low flow member D11 are provided on the surface of the insulating base material layer 11. The linear conductor 31 is a winding shaped (rectangular or substantially rectangular loop shaped) conductor that is wound along the outer periphery of the surface of the insulating base material layer 11. The first low flow member D11 includes a rectangular or substantially rectangular shape and is arranged in a region surrounded by the linear conductor 31. At least a portion of the first low flow member D11 according to the first preferred embodiment of the present invention, as illustrated in FIG. 1B, is arranged in a region surrounded by the linear conductor 31 and arranged along the linear conductor 31. The first low flow member D11 is made of a material that includes a flowability that is lower than the flowability of the insulating base material layer 11 at a temperature (higher than, equal to, or substantially equal to about 250° C. and lower than, equal to, or substantially equal to about 350° C., for example) when heating and pressurizing the insulating base material layer 11. The linear conductor 31 is a conductor pattern made of a material such as copper (Cu), for example, and the first low flow member D11 is a conductor pattern made of a material such as Cu that is the same as the material of the linear conductor 31.

A linear conductor 32 and the second low flow member D21 are provided on the surface of the insulating base material layer 12. The linear conductor 32 is a winding shaped (rectangular or substantially rectangular loop shaped, U shaped, or substantially U shaped) conductor that is wound along the outer periphery of the surface of the insulating base material layer 12. The second low flow member D21 includes a winding (annular or substantially annular) shape and is arranged in a region surrounded by the linear conductor 32. At least a portion of the second low flow member D21 according to the first preferred embodiment of the present invention, as illustrated in FIG. 1B, is arranged in a region surrounded by the linear conductor 32 and arranged along the linear conductor 32. The second low flow member D21 is made of a material that includes a flowability that is lower than the flowability of the insulating base material layer 12 at a temperature (higher than, equal to, or substantially equal to about 250° C. and lower than, equal to, or substantially equal to about 350° C., for example) when heating and pressurizing the insulating base material layer 12. The linear conductor 32 is a conductor pattern made of a material such as Cu, for example, and the second low flow member D21 is a conductor pattern made of a material such as Cu that is the same as the material of the linear conductor 32.

A linear conductor 33 and the first low flow member D12 are provided on the surface of the insulating base material layer 13. The linear conductor 33 is a winding shaped (rectangular loop shaped or substantially rectangular loop shaped) conductor that is wound along the outer periphery of the surface of the insulating base material layer 13. The first low flow member D12 has a plane shape that is rectangular or substantially rectangular, and is arranged in a region surrounded by the linear conductor 33. At least a portion of the first low flow member D12 according to the first preferred embodiment of the present invention, as illustrated in FIG. 1B, is arranged in a region surrounded by the linear conductor 33 and arranged along the linear conductor 33. The material of the first low flow member D12 is the same as the material of the first low flow member D11. The linear conductor 33 is a conductor pattern made of a material such as Cu, for example, and the first low flow member D12 is a conductor pattern made of a material such as Cu that is the same material as the material of the linear conductor 33.

Two external connection electrodes P1 and P2 are provided on the surface of the insulating base material layer 14. The external connection electrode P1 is a rectangular or substantially rectangular shaped conductor arranged near the center of the first side (the left side of the insulating base material layer 14 in FIG. 1B) of the insulating base material layer 14. The external connection electrode P2 is a rectangular or substantially rectangular shaped conductor arranged near the center of the second side (the right side of the insulating base material layer 14 in FIG. 1B) of the insulating base material layer 14. The external connection electrodes P1 and P2 are conductor patterns made of a material such as Cu, for example.

As illustrated in FIG. 1B, the external connection electrode P1 is connected to the first end of the linear conductor 33 through an interlayer connection conductor V3 provided in the insulating base material layer 14. The second end of the linear conductor 33 is connected to the first end of the linear conductor 32 through an interlayer connection conductor V2 provided in the insulating base material layer 13. The second end of the linear conductor 32 is connected to the first end of the linear conductor 31 through an interlayer connection conductor V1 provided in the insulating base material layer 12. The second end of the linear conductor 31 is connected to the external connection electrode P2 through an interlayer connection conductor V4 defined by conductors provided in the plurality of insulating base material layers 12, 13, and 14.

As described above, in the multilayer substrate 101, the plurality of linear conductors 31, 32, and 33 provided on the different insulating base material layers 11, 12, 13, and 14, and the interlayer connection conductors V1, V2, V3, and V4 provide the coil 3 including a rectangular or substantially rectangular helical shape including about 3 turns. The opposite ends of the coil 3 are connected to the external connection electrodes P1 and P2, respectively.

As illustrated in FIGS. 2A and 2B, the coil 3 is provided inside of the stacked body 10, and includes a winding axis AX in the stacking direction (Z-axis direction) of the plurality of insulating base material layers 11, 12, 13, and 14. The coil 3, when viewed in the Z-axis direction, includes a first region E1 surrounded by the plurality of linear conductors 31, 32, and 33 (coil 3).

It is to be noted that, while the first preferred embodiment of the present invention describes an example in which the coil 3 includes the winding axis AX in the stacking direction (Z-axis direction) of the plurality of insulating base material layers 11, 12, 13, and 14, the winding axis AX of the coil 3 and the Z-axis direction are not required to strictly coincide with each other. In various preferred embodiments of the present invention, "including the winding axis in the stacking direction of the plurality of insulating base material layers" includes an example in which the winding axis AX of the coil 3 extending in a range from about minus 30 degrees to about plus 30 degrees with respect to the Z-axis direction, for example.

In addition, at least a portion of the two first low flow members D11 and D12 and at least a portion of the second low flow member D21, as illustrated in FIG. 2A, are arranged in the first region E1 when viewed in the Z-axis direction. The second low flow member D21, when viewed in the Z-axis direction, includes a winding (annular or substantially annular) shape. A second region E2 is a region surrounded by the second low flow member D21. The two first low flow members D11 and D12, when viewed in the Z-axis direction, include a planar or substantially planar shape and at least partially overlap the second region E2.

As illustrated in FIG. 1B and FIG. 2B, the two first low flow members D11 and D12 and the second low flow member D21 are provided on the insulating base material layers 11, 12, and 13 on which the linear conductors 31, 32, and 33 are provided, respectively. Moreover, the multilayer substrate 101 includes a structure in which the two first low flow members D11 and D12 are arranged to interpose the second low flow member D21 in the Z-axis direction.

According to the multilayer substrate 101 of the first preferred embodiment of the present invention, the following advantageous effects are obtained.

In the first preferred embodiment, when viewed in the Z-axis direction, the low flow member (the first low flow members D11 and D12 and the second low flow member D21) is provided in the first region E1 (the opening of the coil 3), so that excessive flow of the insulating base material layer into the opening of the coil 3 during heating and pressurizing is significantly reduced or prevented. Therefore, movement, deformation, or the like of the linear conductor caused by the flow of the insulating base material layer during heating and pressurizing is significantly reduced or prevented. Accordingly, this configuration stabilizes or substantially stabilizes the shape of the coil 3 after heating and pressurizing and thus provides a multilayer substrate including a coil with significantly reduced variation in electrical characteristics and significantly increased electric reliability.

When viewed in the Z-axis direction, when only the low flow member including a planar or substantially planar shape is provided in the first region E1 (opening of the coil 3), the low flow member is densely arranged in the first region E1. Therefore, the flow of the insulating base material layer into the first region E1 during heating and pressurizing is excessively reduced or prevented, the thickness of the opening of the coil becomes larger than the thickness of other portions after heating and pressurizing, which may reduce the flatness of the multilayer substrate. On the other hand, the multilayer substrate 101 according to the first preferred embodiment of the present invention is provided with the second low flow member D21 including a winding shape in addition to the first low flow members D11 and D12 including the planar or substantially planar shape, and the first low flow members D11 and D12 and the second low flow member D21 are arranged in the first region E1. Further, at least a portion of the first low flow members D11 and D12 overlaps the second region E2 surrounded by the second low flow member D21, and the second low flow member D21 including the winding shape includes an area smaller than the area of the first low flow members D11 and D12 including the planar or substantially planar shape. Accordingly, this configuration provides a multilayer substrate of which flatness is significantly increased without excessively reducing or preventing the flow of the insulating base material layer into the first region E1 during heating and pressurizing.

In the multilayer substrate 101, all the first low flow members D11 and D12 and the second low flow member D21 are made of the same material as the material of the plurality of linear conductors 31, 32, and 33. With this configuration, the linear conductors 31, 32, and 33, the first low flow members D11 and D12, and the second low flow member D21 are able to be formed in the same (one) process to significantly simplify the manufacturing process.

In the first preferred embodiment, although the first low flow members D11 and D12 and the second low flow member D21 are the same material as the plurality of linear conductors 31, 32, and 33, the first low flow members D11 and D12 at least partially overlap the second region E2 (opening) when viewed in the Z-axis direction such that losses caused by interlinking the magnetic flux generated in the coil 3 with the second low flow member D21 are significantly reduced or prevented.

Furthermore, in the first preferred embodiment, the two first low members D11 and D12 including a planar or substantially planar shape are arranged to interpose the second low flow member D21 including the winding shape in the Z-axis direction. Therefore, losses caused by interlinking the magnetic flux generated in the coil 3 with the second low flow member D21 are further significantly reduced or prevented.

Moreover, the first low flow members D11 and D12 and the second low flow member D21 are provided on the insulating base material layers 11, 12, and 13 on which the linear conductors 31, 32, and 33 are respectively provided. With this configuration, in comparison with the first low flow member (or the second low flow member) and the linear conductor being provided on different insulating base material layers, the distance between the first low flow members D11 and D12 (or the second low flow member D21) and the linear conductors 31, 32, and 33 is significantly reduced. Therefore, the effect of reducing the flow of the insulating base material layers 11, 12, and 13 by the first low flow members D11 and D12 (or the second low flow member D21) during heating and pressurizing is significantly improved.

It is noted that, while the first preferred embodiment is a non-limiting example in which both the first low flow members D11 and D12 and the second low flow member D21 are provided on the insulating base material layers 11, 12, and 13 on which the linear conductors 31, 32, and 33 are respectively provided, the present invention is not limited to such a configuration. If either the first low flow members D11 and D12 or the second low flow member D21 is provided on at least one of the insulating base material layers 11, 12, and 13 on which the linear conductors 31, 32, and 33 are respectively provided, the above functions and effects are obtained.

In addition, as described in the first preferred embodiment, the first low flow member and the second low flow member do not need to be provided on all of the plurality of insulating base material layers. The first low flow member and the second low flow member may be provided on any one of the plurality of insulating base material layers.

It is noted that, while the first preferred embodiment is a non-limiting example of the multilayer substrate 101 provided with the two first low flow members D11 and D12 and the second low flow member D21, as described in detail in the following preferred embodiment, the present invention is not limited to such a configuration. In a multilayer substrate according to a preferred embodiment of the present invention, if both of the number of first low flow members and the number of second low flow members are at least one or more, the functions and effects of the present invention are obtained.

Second Preferred Embodiment

In a second preferred embodiment of the present invention, a description will be given of a multilayer substrate with a structure in which a plurality of second low flow members are provided on the surface of an insulating base material layer.

Figure 3A:
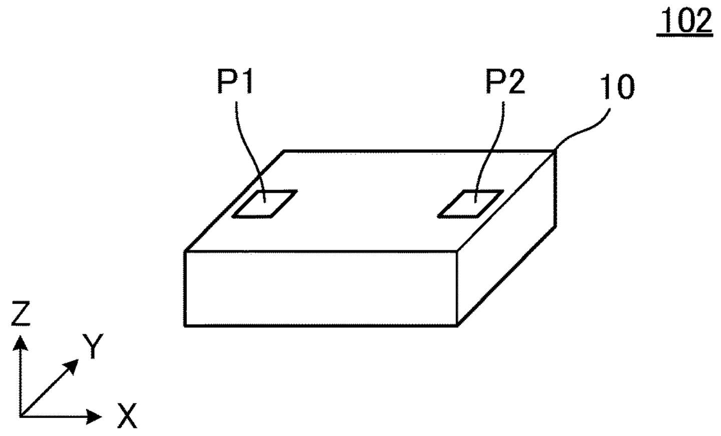
FIG. 3A is a perspective view of a multilayer substrate 102 according to a second preferred embodiment of the present invention.
Figure 3B:
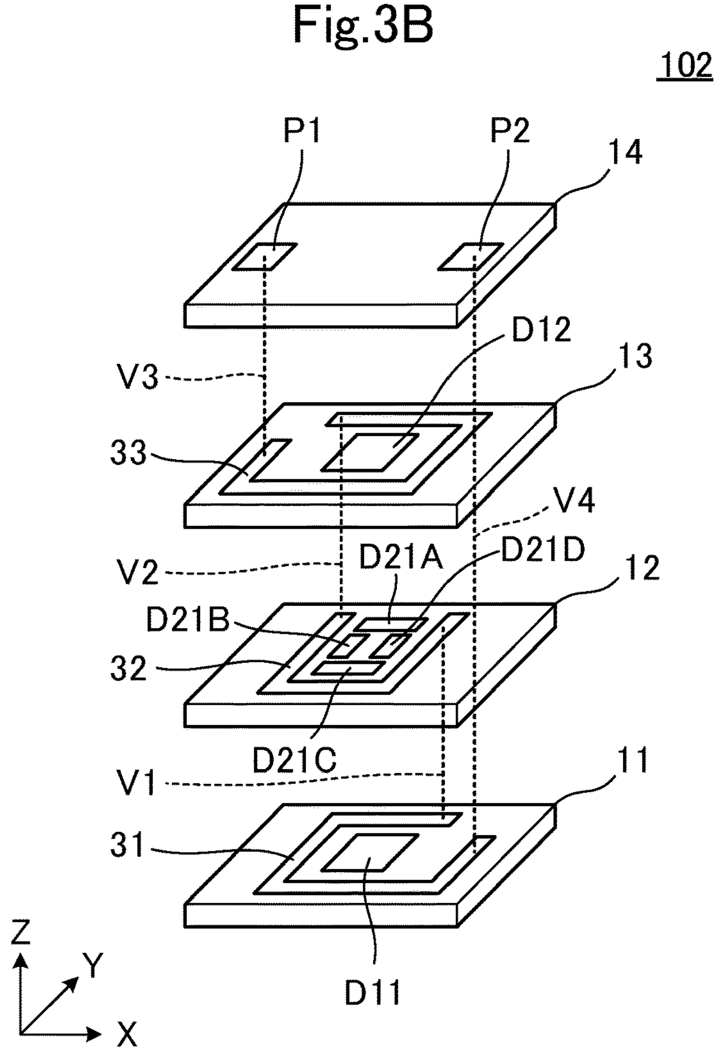
FIG. 3B is an exploded perspective view of the multilayer substrate 102.
Figure 4:
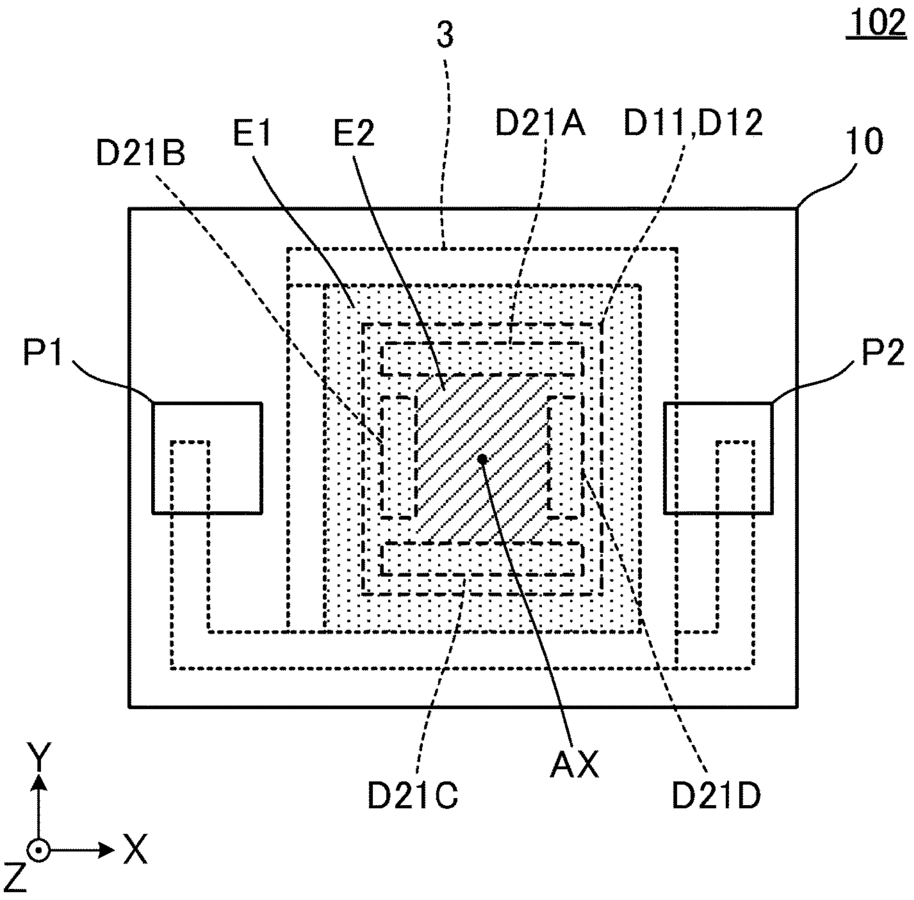
FIG. 4 is a plan view of the multilayer substrate 102.

FIG. 3A is a perspective view of a multilayer substrate 102 according to the second preferred embodiment of the present invention, and FIG. 3B is an exploded perspective view of the multilayer substrate 102. FIG. 4 is a plan view of the multilayer substrate 102.

The multilayer substrate 102 is different from the multilayer substrate 101 according to the first preferred embodiment in that four second low flow members are provided on the surface of the insulating base material layer 12. Other configurations of the multilayer substrate 102 are the same or substantially the same as the configurations of the multilayer substrate 101.

A linear conductor 32 and four second low flow members D21A, D21B, D21C, and D21D are provided on the surface of the insulating base material layer 12. The second low flow members D21A and D21C each include a plane shape that is a linear or substantially linear shape extending in the X-axis direction. The second low flow members D21B and D21D each include a plane shape that is a linear or substantially linear shape extending in the Y-axis direction. The second low flow members D21A, D21B, D21C, and D21D are arranged in a winding (annular or substantially annular) shape along the linear conductor 32, in a region surrounded by the linear conductor 32.

As illustrated in FIG. 4, the second low flow members D21A, D21B, D21C, and D21D, when viewed in the Z-axis direction, are arranged in a winding (annular or substantially annular) shape along the outer edge of the first region E1, in the first region E1 surrounded by the plurality of linear conductors 31, 32, and 33.

It is to be noted that the configuration in which a second low flow member according to a preferred embodiment of the present invention "includes a winding shape" is not limited to a configuration in which one second low flow member includes an annular or substantially annular shape when viewed in the Z-axis direction, as described in the first preferred embodiment. As described in the second preferred embodiment, when viewed in the Z-axis direction, when a plurality of second low flow members are annularly or substantially annularly arranged, in the first region E1, along the outer edge of the first region E1, the second low flow members according to various preferred embodiments of the present invention are defined to "include a winding shape".

As also described in the second preferred embodiment, a plurality of second low flow members may be provided on one insulating base material layer. It is to be noted that, even when the plurality of second low flow members are provided on one insulating base material layer, the plurality of second low flow members are arranged, when viewed in the Z-axis direction, in a winding shape along the first region E1 surrounded by the linear conductor in the first region E1, such that the same functions and effects as those of the multilayer substrate according to the first preferred embodiment are also obtained.

It is noted that, while the second preferred embodiment describes an example in which the four second low flow members D21A, D21B, D21C, and D21D are provided on the surface of the insulating base material layer 12, the present invention is not limited to such a configuration. A plurality of second low flow members other than the four second low flow members may be configured to be provided on the surface of one insulating base material layer. Even in such a case, the plurality of second low flow members are preferably arranged in a winding shape, when viewed in the Z-axis direction, in the first region E1 surrounded by the linear conductor, along the outer edge of the first region E1. Furthermore, the plurality of second low flow members may be provided on any one of the plurality of insulating base material layers, or may be provided on an insulating base material layer other than the insulating base material layer 12.

Third Preferred Embodiment

In a third preferred embodiment of the present invention, a description will be given of a multilayer substrate with a structure in which a plurality of second low flow members are each provided on the surfaces of different insulating base material layers.

Figure 5A:
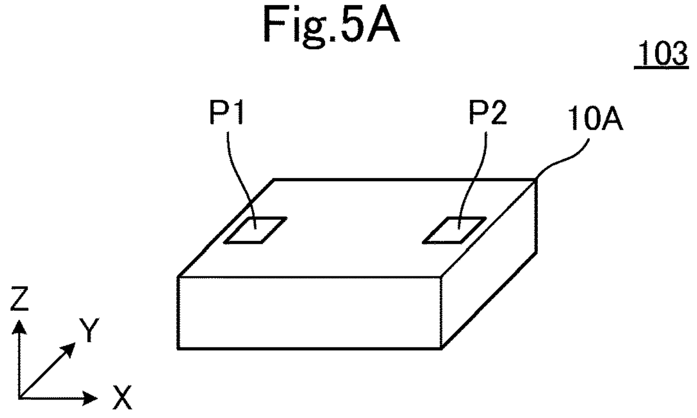
FIG. 5A is a perspective view of a multilayer substrate 103 according to a third preferred embodiment of the present invention.
Figure 5B:
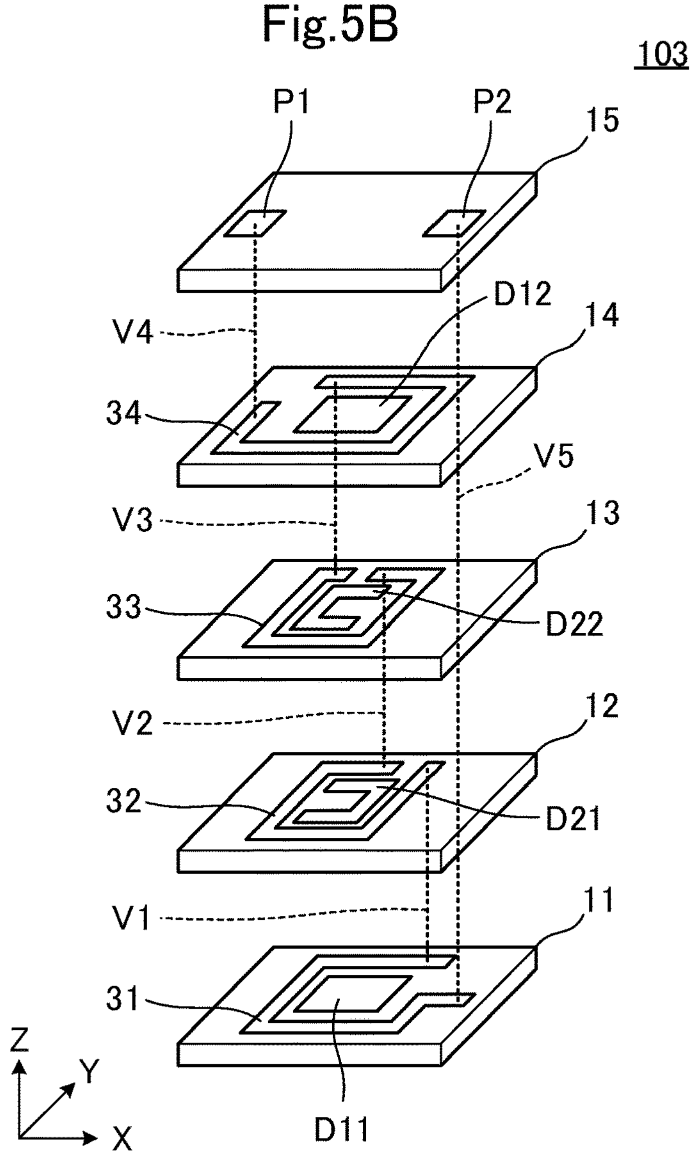
FIG. 5B is an exploded perspective view of the multilayer substrate 103.
Figure 6:
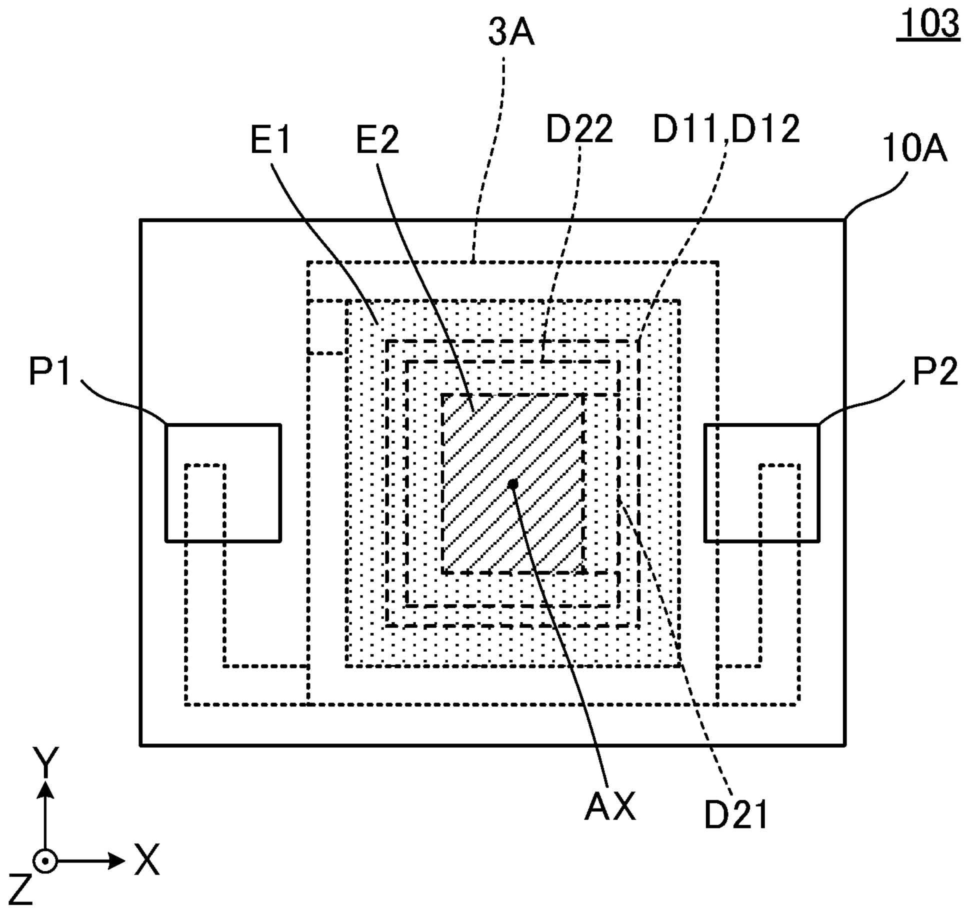
FIG. 6 is a plan view of the multilayer substrate 103.

FIG. 5A is a perspective view of a multilayer substrate 103 according to the third preferred embodiment of the present invention, and FIG. 5B is an exploded perspective view of the multilayer substrate 103. FIG. 6 is a plan view of the multilayer substrate 103.

The multilayer substrate 103 is provided with a stacked body 10A, a coil 3A (to be described in detail later), and two first low flow members D11 and D12 and two second low flow members D21 and D22 that are provided in contact with the stacked body 10A.

The stacked body 10A, as illustrated in FIG. 5B, is formed by heating and pressurizing a plurality of insulating base material layers 11, 12, 13, 14, and 15 that are made of thermoplastic resin. The plurality of insulating base material layers 11, 12, 13, 14, and 15 are each a flat or substantially flat plate of which the plane shape is rectangular or substantially rectangular and has a longitudinal direction that coincides with the X-axis direction.

A linear conductor 31 and the first low flow member D11 are provided on the surface of the insulating base material layer 11. The configuration of the linear conductor 31 and the first low flow member D11 is the same or substantially the same as the configuration described in the first preferred embodiment.

A linear conductor 32 and the second low flow member D21 are provided on the surface of the insulating base material layer 12. The linear conductor 32 is a winding shaped (rectangular or substantially rectangular loop-shaped) conductor that is wound along the outer periphery of the surface of the insulating base material layer 12. The second low flow member D21 includes a plane shape that is a winding shape (U shaped, substantially U shaped, C shaped, or substantially C shaped), and is arranged in a region surrounded by the linear conductor 32. In addition, at least a portion of the second low flow member D21 according to the third preferred embodiment of the present invention, as illustrated in FIG. 5B, is arranged in a region surrounded by the linear conductor 32 and arranged along the linear conductor 32.

A linear conductor 33 and the second low flow member D22 are provided on the surface of the insulating base material layer 13. The linear conductor 33 is a conductor that includes a winding shape (rectangular or substantially rectangular loop shape) and is wound along the outer periphery of the surface of the insulating base material layer 13. The second low flow member D22 includes a plane shape that is a winding shape (U shaped, substantially U shaped, C shaped, or substantially C shaped), and is arranged in a region surrounded by the linear conductor 33. Moreover, at least a portion of the second low flow member D22 according to the third preferred embodiment of the present invention, as illustrated in FIG. 5B, is arranged in a region surrounded by the linear conductor 33 and arranged along the linear conductor 33.

A linear conductor 34 and the first low flow member D12 are provided on the surface of the insulating base material layer 14. The linear conductor 34 includes a winding shape (rectangular or substantially rectangular loop shape) and is wound along the outer periphery of the surface of the insulating base material layer 14. The first low flow member D12 includes a plane shape that is rectangular or substantially rectangular, and is arranged in a region surrounded by the linear conductor 34. At least a portion of the first low flow member D12 according to the third preferred embodiment of the present invention, as illustrated in FIG. 5B, is arranged in a region surrounded by the linear conductor 34 and arranged along the linear conductor 34.

Two external connection electrodes P1 and P2 are provided on the surface of the insulating base material layer 15. The external connection electrode P1 is a rectangular or substantially rectangular shaped conductor arranged near the center of the first side (the left side of the insulating base material layer 15 in FIG. 5B) of the insulating base material layer 15. The external connection electrode P2 is a rectangular or substantially rectangular shaped conductor arranged near the center of the second side (the right side of the insulating base material layer 15 in FIG. 5B) of the insulating base material layer 15.

As illustrated in FIG. 5B, the external connection electrode P1 is connected to the first end of the linear conductor 34 through an interlayer connection conductor V4 provided in the insulating base material layer 15. The second end of the linear conductor 34 is connected to the first end of the linear conductor 33 through an interlayer connection conductor V3 provided in the insulating base material layer 14. The second end of the linear conductor 33 is connected to the first end of the linear conductor 32 through an interlayer connection conductor V2 provided in the insulating base material layer 13. The second end of the linear conductor 32 is connected to the first end of the linear conductor 31 through an interlayer connection conductor V1 provided in the insulating base material layer 12. The second end of the linear conductor 31 is connected to the external connection electrode P2 through an interlayer connection conductor V5 defined by conductors provided in the plurality of insulating base material layers 12, 13, 14, and 15.

As described above, in the multilayer substrate 103, the plurality of linear conductors 31, 32, 33, and 34 that are each provided on the different insulating base material layers 11, 12, 13, 14, and 15 and the interlayer connection conductors V1, V2, V3, V4, and V5 provide the coil 3A including a rectangular or substantially rectangular helical shape including about 4 turns, for example. The opposite ends of the coil 3A are connected to the external connection electrodes P1 and P2, respectively.

As illustrated in FIG. 6, the two first low flow members D11 and D12 and the two second low flow members D21 and D22, when viewed in the Z-axis direction, are arranged in the first region E1. The second low flow members D21 and D22, when viewed in the Z-axis direction, are arranged in a winding (annular or substantially annular) shape. A second region E2 is a region surrounded by the second low flow members D21 and D22. The two first low flow members D11 and D12, when viewed in the Z-axis direction, include a planar or substantially planar shape and at least partially overlap the second region E2.

It is to be noted that, as described in the third preferred embodiment, when the plurality of second low flow members are each provided on different insulating base material layers, and, when viewed in the Z-axis direction, the plurality of second low flow members are arranged in an annular or substantially annular shape along the first region E1, in the first region E1, the second low flow members according to various preferred embodiments of the present invention are also defined to "include a winding shape".

As described in the third preferred embodiment, the plurality of second low flow members are each provided on the surface of different insulating base material layers among the plurality of insulating base material layers. It is to be noted that, even when the plurality of second low flow members are each provided on different insulating base material layers, the plurality of second low flow members are arranged, when viewed in the Z-axis direction, in a winding shape along the outer edge of the first region E1, in the first region E1 surrounded by the linear conductor, so that the same functions and effects as those of the multilayer substrate according to the first preferred embodiment are obtained.

It is noted that, while the third preferred embodiment is a non-limiting example in which the second low flow members D21 and D22 provided on different insulating base material layers are not connected to each other, the present invention is not limited to such a configuration. The plurality of second low flow members provided on different insulating base material layers may be connected to each other.

Fourth Preferred Embodiment

In a fourth preferred embodiment of the present invention, a description will be given of a multilayer substrate in which a low flow member is provided on the surface of a stacked body.

Figure 7A:
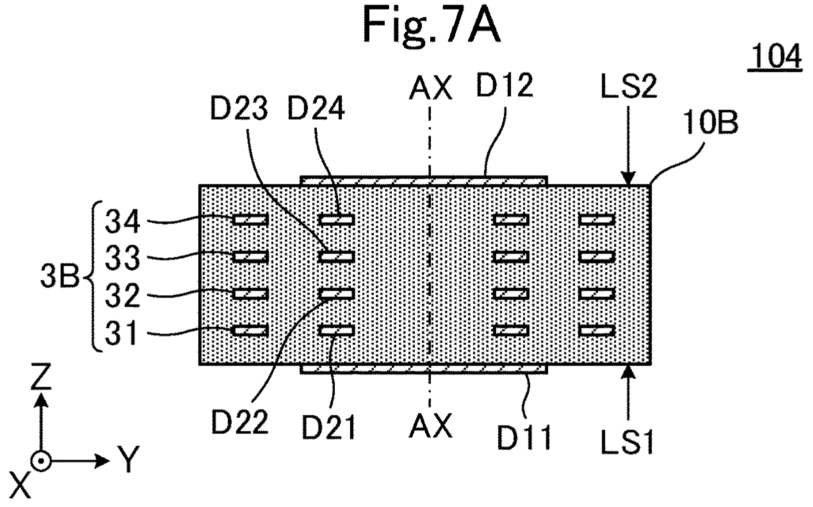
FIG. 7A is a cross-sectional view of a multilayer substrate 104 according to a fourth preferred embodiment of the present invention.
Figure 7B:
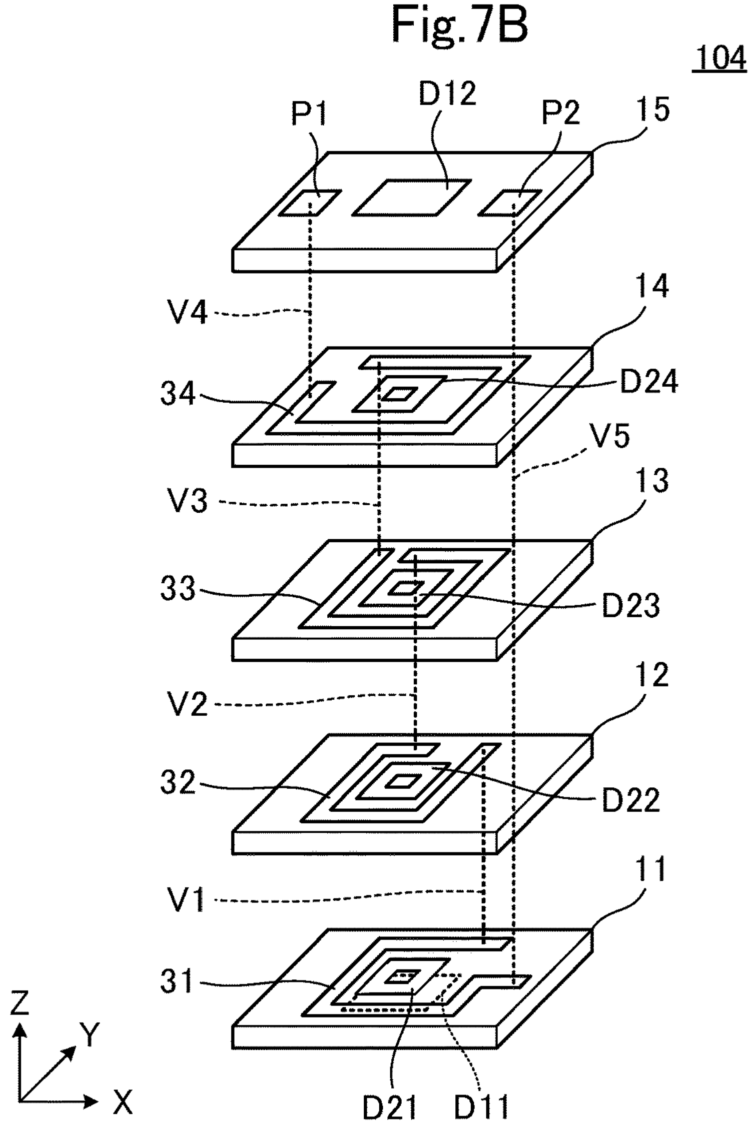
FIG. 7B is an exploded perspective view of the multilayer substrate 104.
Figure 8:
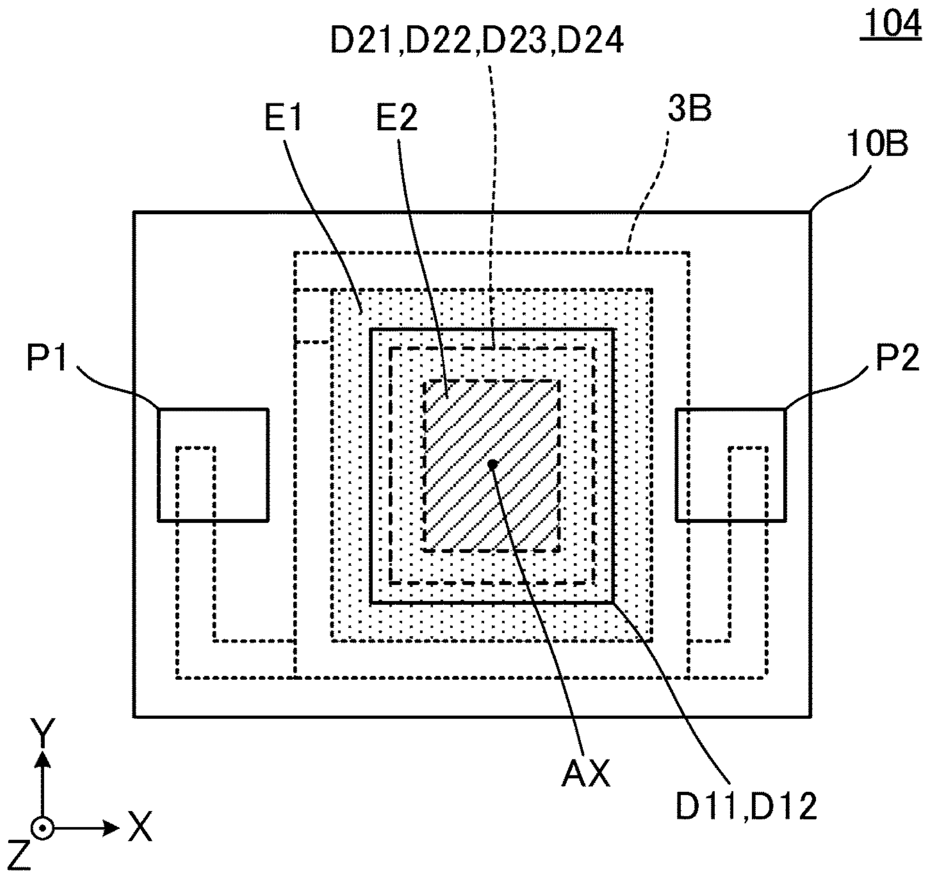
FIG. 8 is a plan view of the multilayer substrate 104.

FIG. 7A is a cross-sectional view of a multilayer substrate 104 according to the fourth preferred embodiment of the present invention, and FIG. 7B is an exploded perspective view of the multilayer substrate 104. FIG. 8 is a plan view of the multilayer substrate 104.

The multilayer substrate 104 is provided with a stacked body 10B, a coil 3B (to be described in detail later), and two first low flow members D11 and D12 and four second low flow members D21, D22, D23, and D24 that are provided in contact with the stacked body 10B. As illustrated in FIG. 7A, the first low flow member D11 is provided on the first principal surface LS1 of the stacked body 10B, and the first low flow member D12 is provided on the second principal surface LS2 of the stacked body 10B. The four second low flow members D21, D22, D23, and D24 are provided inside of the stacked body 10B.

The stacked body 10B, as illustrated in FIG. 7B, is formed by heating and pressurizing a plurality of insulating base material layers 11, 12, 13, 14, and 15 that are made of thermoplastic resin.

A linear conductor 31 and the second low flow member D21 are provided on the surface of the insulating base material layer 11. The linear conductor 31 is a conductor that includes a winding shape (rectangular or substantially rectangular loop shape) and is wound along the outer periphery of the surface of the insulating base material layer 11. The second low flow member D21 includes a plane shape that is a winding (annular or substantially annular) shape, and is arranged in a region surrounded by the linear conductor 31. Further, the first low flow member D11 is provided on the back surface of the insulating base material layer 11, opposite to the second low flow member D21. The first low flow member D11 includes a plane shape that is rectangular or substantially rectangular.

A linear conductor 32 and the second low flow member D22 are provided on the surface of the insulating base material layer 12. The configuration of the linear conductor 32 and the second low flow member D22 is substantially the same as the configuration of the linear conductor 31 and the second low flow member D21.

A linear conductor 33 and the second low flow member D23 are provided on the surface of the insulating base material layer 13. The configuration of the linear conductor 33 and the second low flow member D23 is substantially the same as the configuration of the linear conductor 31 and the second low flow member D21.

A linear conductor 34 and the second low flow member D24 are provided on the surface of the insulating base material layer 14. The configuration of the linear conductor 34 and the second low flow member D24 is substantially the same as the configuration of the linear conductor 31 and the second low flow member D21.

The first low flow member D12 and two external connection electrodes P1 and P2 are provided on the surface of the insulating base material layer 15. The first low flow member D12 includes a plane shape that is rectangular or substantially rectangular. The external connection electrode P1 is a rectangular or substantially rectangular shaped conductor arranged near the center of the first side (the left side of the insulating base material layer 15 in FIG. 7B) of the insulating base material layer 15. The external connection electrode P2 is a rectangular or substantially rectangular shaped conductor arranged near the center of the second side (the right side of the insulating base material layer 15 in FIG. 7B) of the insulating base material layer 15.

In the multilayer substrate 104, the plurality of linear conductors 31, 32, 33, and 34 that are each provided on the different insulating base material layers 11, 12, 13, 14, and 15 and the interlayer connection conductors V1 to V5, as in the first to third preferred embodiments, provide the coil 3B including a rectangular or substantially rectangular helical shape including about 4 turns.

As described in the fourth preferred embodiment, the first low flow member is provided on the surface (principal surface) of the stacked body 10B. In addition, while the fourth preferred embodiment describes an example in which the two first low flow members are provided on the surface of the stacked body 10B and the four second low flow members are provided inside of the stacked body 10B, the present invention is not limited to such a configuration. The second low flow member may be provided on the surface of the stacked body 10B.

Fifth Preferred Embodiment

In a fifth preferred embodiment of the present invention, a description will be given of a multilayer substrate with a structure in which a low flow member is provided on an insulating base material layer on which no linear conductor is provided.

Figure 9A:
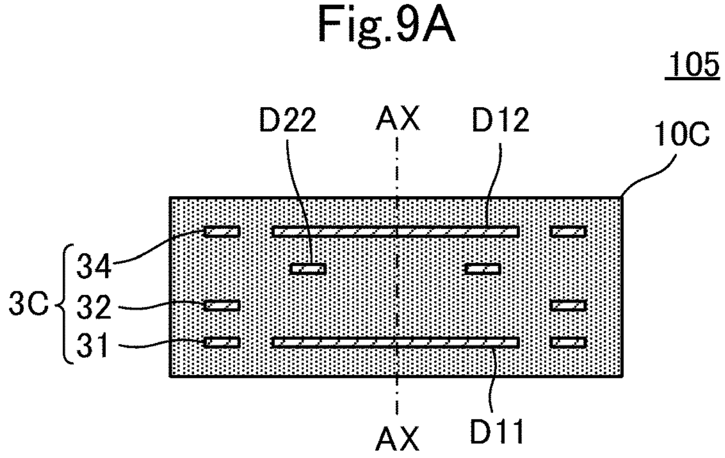
FIG. 9A is a cross-sectional view of a multilayer substrate 105 according to a fifth preferred embodiment of the present invention.
Figure 9B:
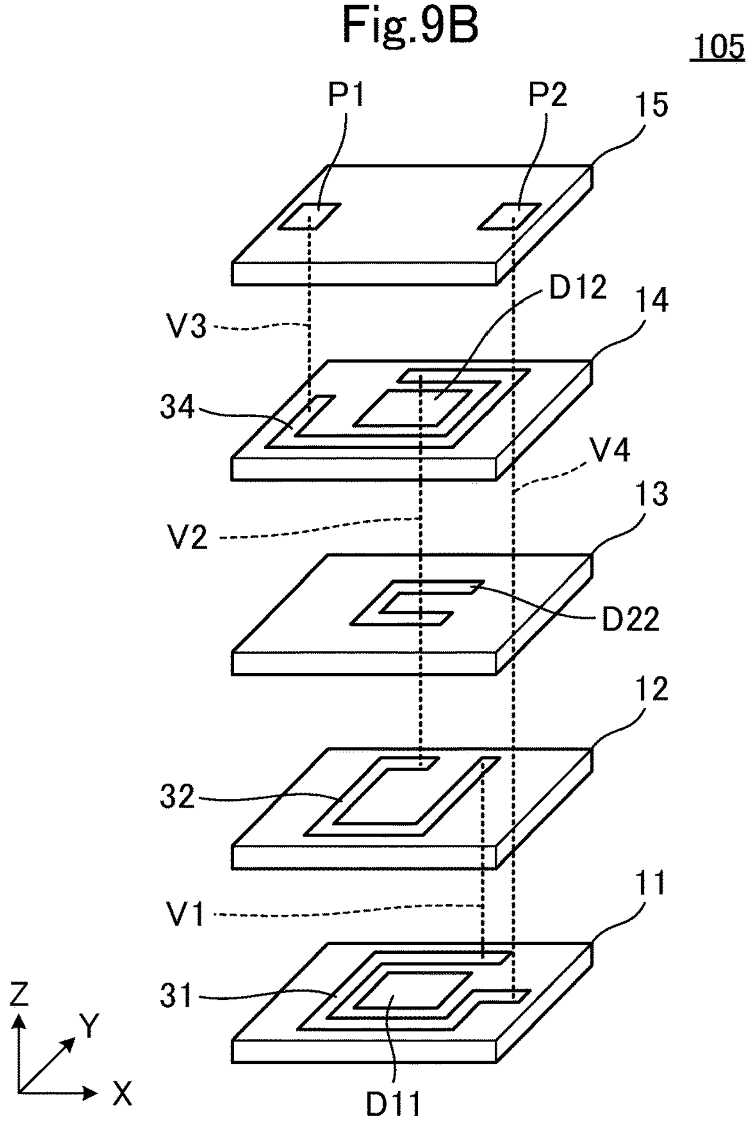
FIG. 9B is an exploded perspective view of the multilayer substrate 105.

FIG. 9A is a cross-sectional view of a multilayer substrate 105 according to the fifth preferred embodiment of the present invention, and FIG. 9B is an exploded perspective view of the multilayer substrate 105.

The multilayer substrate 105 is different from the multilayer substrate 103 according to the third preferred embodiment in that the number of linear conductors is three and the number of second low flow members is one, for example. Other configurations are the same or substantially the same as the configurations of the multilayer substrate 103.

The multilayer substrate 105 is provided with a stacked body 10C, a coil 3C (to be described in detail later), and two first low flow members D11 and D12 and a second low flow member D22 that are provided in contact with the stacked body 10C.

The stacked body 10C, as illustrated in FIG. 9B, is formed by heating and pressurizing a plurality of insulating base material layers 11, 12, 13, 14, and 15 that are made of thermoplastic resin.

A linear conductor 31 and the first low flow member D11 are provided on the surface of the insulating base material layer 11. The configuration of the linear conductor 31 and the first low flow member D11 is substantially the same as the configuration described in the third preferred embodiment.

A linear conductor 32 is provided on the surface of the insulating base material layer 12. The configuration of the linear conductor 32 is substantially the same as the configuration described in the third preferred embodiment.

The second low flow member D22 is provided on the surface of the insulating base material layer 13. The configuration of the second low flow member D22 is substantially the same as the configuration described in the third preferred embodiment.

A linear conductor 34 and the first low flow member D12 are provided on the surface of the insulating base material layer 14. The configuration of the linear conductor 34 and the first low flow member D12 is the same or substantially the same as the configuration described in the third preferred embodiment.

Two external connection electrodes P1 and P2 are provided on the surface of the insulating base material layer 15. The configuration of the external connection electrodes P1 and P2 is substantially the same as the configuration described in the third preferred embodiment.

As illustrated in FIG. 9B, the external connection electrode P1 is connected to the first end of the linear conductor 34 through an interlayer connection conductor V3 provided in the insulating base material layer 15. The second end of the linear conductor 34 is connected to the first end of the linear conductor 32 through an interlayer connection conductor V2 defined by conductors provided in the insulating base material layers 13 and 14. The second end of the linear conductor 32 is connected to the first end of the linear conductor 31 through an interlayer connection conductor V1 provided in the insulating base material layer 12. The second end of the linear conductor 31 is connected to the external connection electrode P2 through an interlayer connection conductor V4 defined by conductors provided in the plurality of insulating base material layers 12, 13, 14, and 15.

As described above, in the multilayer substrate 105, the plurality of linear conductors 31, 32, and 34 provided on the different insulating base material layers 11, 12, 13, 14 and 15, and the interlayer connection conductors V1, V2, V3, and V4 provide the coil 3C including a rectangular or substantially rectangular helical shape including about 3 turns, for example.

As described in the fifth preferred embodiment, the second low flow member is provided on the insulating base material layer on which no linear conductor is provided. Alternatively, the first low flow member may be provided on the insulating base material layer on which no linear conductor is provided. In other words, multilayer substrates according to various preferred embodiments of the present invention may be configured so that the linear conductor and the low flow member (the first low flow member or the second low flow member) are each provided on different insulating base material layers. The first low flow member or the second low flow member, however, as described above (the first preferred embodiment), is preferably provided on the insulating base material layer on which at least the linear conductor is provided. In addition, the plurality of insulating base material layers may include an insulating base material layer on which none of the linear conductor, the first low flow member, and the second low flow member is provided.

Sixth Preferred Embodiment

In a sixth preferred embodiment of the present invention, a description will be given of a multilayer substrate with a structure in which a low flow member is arranged outside a first region E1 when viewed in a direction (Z-axis direction) in which a plurality of insulating base material layers are stacked.

Figure 10:
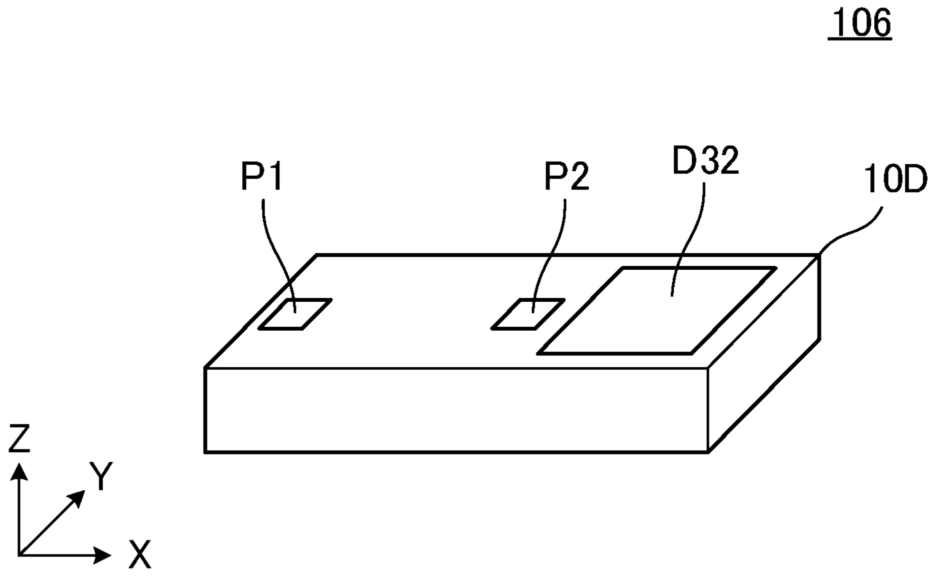
FIG. 10 is a perspective view of a multilayer substrate 106 according to a sixth preferred embodiment of the present invention.
Figure 11A:
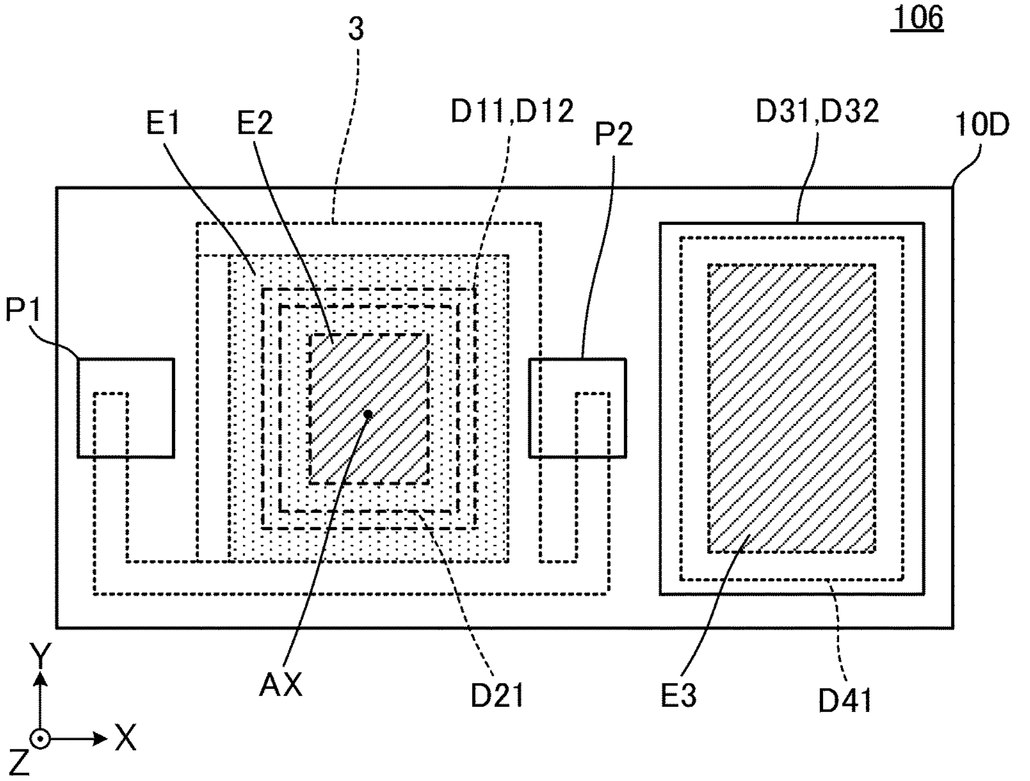
FIG. 11A is a plan view of the multilayer substrate 106.
Figure 11B:
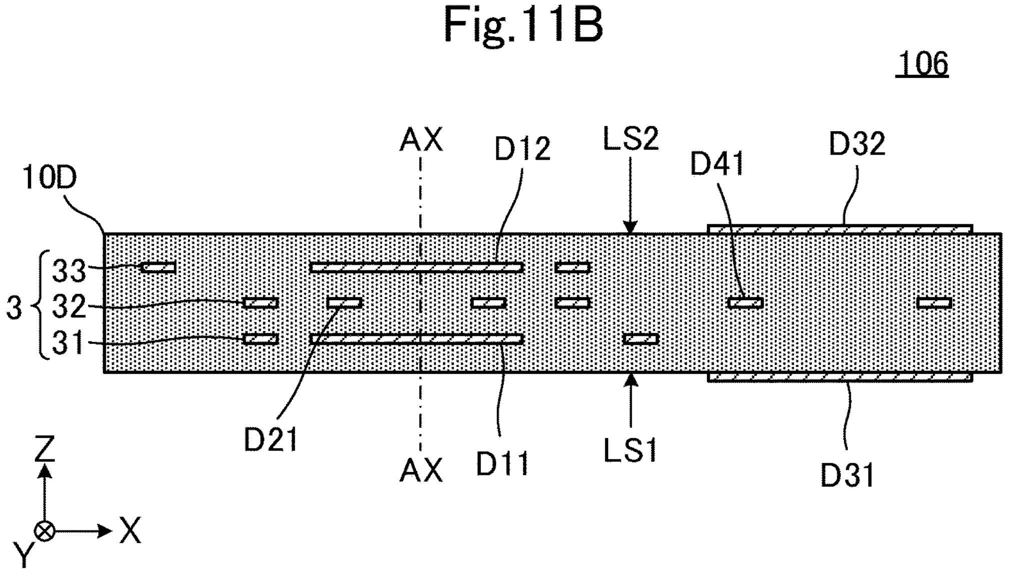
FIG. 11B is a cross-sectional view of the multilayer substrate 106.

FIG. 10 is a perspective view of a multilayer substrate 106 according to the sixth preferred embodiment of the present invention. FIG. 11A is a plan view of the multilayer substrate 106, and FIG. 11B is a cross-sectional view of the multilayer substrate 106. In addition, in FIG. 11A, in order to make the structure more understandable, the first region E1 is indicated by a dot pattern and a second region E2 and a third region E3 are indicated by hatching. The same may be applied to a plan view in each of the following preferred embodiments.

The multilayer substrate 106 is different from the multilayer substrate 101 according to the first preferred embodiment in that two third low flow members D31 and D32 and a fourth low flow member D41 are further provided. Other configurations of the multilayer substrate 106 are the same or substantially the same as the configurations of the multilayer substrate 101.

The multilayer substrate 106 is provided with a stacked body 10D, a coil 3, and two first low flow members D11 and D12, a second low flow member D21, two third low flow members D31 and D32, and a fourth low flow member D41 that are provided in contact with the stacked body 10D. The third low flow member D31 is provided on the first principal surface LS1 of the stacked body 10D, and the third low flow member D32 is provided on the second principal surface LS2 of the stacked body 10D. The fourth low flow member D41 is provided inside of the stacked body 10D.

The stacked body 10D has a rectangular or substantially rectangular parallelepiped shape that is made of thermoplastic resin and includes a length in the longitudinal direction (X-axis direction) that is larger than the length of the stacked body 10 described in the first preferred embodiment.

The coil 3, the two first low flow members D11 and D12, the second low flow member D21, and the external connection electrodes P1 and P2, when viewed in the Z-axis direction, are each arranged at a position closer to the first side (left side of the stacked body 10D in FIG. 11A) from the center of the stacked body 10D. In addition, the two third low flow members D31 and D32 and the fourth low flow member D41, when viewed in the Z-axis direction, are each arranged at a position closer to the second side (right side of the stacked body 10D in FIG. 11A) from the center of the stacked body 10D. In other words, the two third low flow members D31 and D32 and the fourth low flow member D41, when viewed in the Z-axis direction, are each arranged outside of the first region E1 and at a position that does not overlap the plurality of linear conductors 31, 32, and 33 (coil 3). It is to be noted that the third low flow member and the fourth low flow member are provided on any one of the plurality of insulating base material layers like the first low flow member and the second low flow member. The first low flow members D11 and D12, the second low flow member D21, the third low flow members D31 and D32, and the fourth low flow member D41 are each a conductor pattern made of a material such as Cu that is the same material as the linear conductor 31, for example.

Moreover, as illustrated in FIG. 11A, the fourth low flow member D41 includes a winding (annular or substantially annular) shape, when viewed in the Z-axis direction. A third region E3 is a region surrounded by the fourth low flow member D41. The two third low flow members D31 and D32, when viewed in the Z-axis direction, include a planar or substantially planar shape and at least partially overlap the third region E3.

Furthermore, as illustrated in FIG. 11B, the multilayer substrate 106 includes a structure in which the two third low flow members D31 and D32 are arranged so as to interpose the fourth low flow member D41 in the Z-axis direction.

As described in the sixth preferred embodiment, a multilayer substrate according to a preferred embodiment of the present invention is provided with a low flow member (a third low flow member and a fourth low flow member) in addition to the first low flow member and the second low flow member, the low flow member being arranged outside the first region E1 (the opening of the coil 3) when viewed in the Z-axis direction. It is to be noted that the low flow member to be arranged outside the first region E1 when viewed in the Z-axis direction may be only a third low flow member or only a fourth low flow member. In addition, the low flow member to be arranged outside the first region E1 when viewed in the Z-axis direction may be provided either on the surface or inside of the stacked body. However, like the configuration of the first low flow member and the second low flow member, the third low flow member may have a planar or substantially planar shape, when viewed in the Z-axis direction, and may preferably at least partially overlap the third region E3. Furthermore, as described in the sixth preferred embodiment, the fourth low flow member D41 is preferably arranged to interpose the two third low flow members D31 and D32 in the Z-axis direction.

According to the multilayer substrate 106 of the sixth preferred embodiment of the present invention, the following advantageous effects in addition to the advantageous effects described in the first preferred embodiment are obtained.

In the sixth preferred embodiment, the third low flow members D31 and D32 and the fourth low flow member D41, when viewed in the Z-axis direction, are arranged outside of the first region E1 (and the second region E2). With this configuration, since the flow of the insulating base material layers outside of the coil opening during heating and pressurizing is significantly reduced or prevented, and movement, deformation, or the like of the linear conductor caused by the flow of the insulating base material layers during heating and pressurizing is further reduced or prevented. Therefore, this configuration further stabilizes the shape of the coil after heating and pressurizing and thus provides a multilayer substrate including a coil of which the electric reliability has been significantly increased.

Other Preferred Embodiments

While each of the above described preferred embodiments exemplarily describes a configuration in which the second low flow member is arranged to interpose the two first low flow members in the Z-axis direction, the present invention is not limited to this configuration example. In multilayer substrates according to preferred embodiments of the present invention, if both of the number of first low flow members and the number of second low flow members are one or more, the functions and effects of preferred embodiments of the present invention are obtained. In addition, in the multilayer substrates according to preferred embodiments of the present invention, the arrangement of the first low flow member and the second low flow member in the Z-axis direction is able to be appropriately changed in the range in which the functions and effects of the present invention are obtained. In other words, the multilayer substrates of preferred embodiments of the present invention may be configured to be arranged in the Z-axis direction in order of the first low flow member and the second low flow member, for example, or may be configured to be arranged in the Z-axis direction in order of the second low flow member, the first low flow member, and the second low flow member, for example. Moreover, the multilayer substrate of the present invention may be configured to be arranged in the Z-axis direction in order of the first low flow member, the second low flow member, the first low flow member, the second low flow member, and the first low flow member, for example. The same may be applied to the arrangement of the third low flow member and the fourth low flow member in the Z-axis direction.

While each of the above described preferred embodiments is a non-limiting example in which the stacked body has a rectangular or substantially rectangular parallelepiped shape, the present invention is not limited to such a configuration. The stacked body may be a cube, substantially a cube, or a similar shape. In addition, the plane shape of the stacked body is not limited to a rectangle or substantially a rectangle and is able to be appropriately changed in the range in which the functions and effects of the present invention are obtained. The plane shape of the stacked body may be a circle, an ellipse, a polygon, an L shape, a T shape, or a Y shape, for example.

While each of the above described preferred embodiments describes the multilayer substrate provided with the stacked body formed by heating and pressurizing four or five insulating base material layers, the present invention is not limited to such a configuration. The number of insulating base material layers is able to be appropriately changed in the range in which the functions and effects of preferred embodiments of the present invention are obtained.

In addition, while each of the above described preferred embodiments has described an example in which the plane shape of the first low flow member (or the third low flow member) is a rectangle or substantially a rectangle, the present invention is not limited to such a configuration. The plane shape of the first low flow member (or the third low flow member) is able to be appropriately changed in the range in which the functions and effects of preferred embodiments of the present invention are obtained, and may be a circle, an ellipse, and a polygon, for example.

While each of the above described preferred embodiments is an example in which the first low flow member and the second low flow member (or the third low flow member and the fourth low flow member) are a conductor pattern made of a material such as Cu that is the same material as the material of the linear conductor, preferred embodiments of the present invention are not limited to such a configuration. The material of the first low flow member, the second low flow member, the third low flow member, and the fourth low flow member may be any material of which the flowability is lower than the flowability of the insulating base material layers at a temperature during heating and pressurizing of the insulating base material layers and is able to be appropriately changed in the range in which the functions and effects of the present invention are obtained. In addition, the first low flow member, the second low flow member, the third low flow member, and the fourth low flow member may be a magnetic body such as permalloy or magnetic ferrite, for example. When the first low flow member and the second low flow member are each a magnetic body, a multilayer substrate provided with a coil of which the inductance value is significantly increased with respect to the number of turns and the like is achieved.

While each of the above described preferred embodiments describes the multilayer substrate in which the coil including a rectangular or substantially rectangular helical shape including about 3 turns or about 4 turns, for example, is provided in the stacked body, the present invention is not limited to such a configuration. The shape of the coil and the number of turns are able to be appropriately changed in the range in which the functions and effects of the present invention are obtained. Moreover, the coils according to various preferred embodiments of the present invention may be configured to be partially exposed from the surface of the stacked body.

In addition, while each of the above described preferred embodiments is a non-limiting example of a coil including a plurality of loop shaped or substantially loop shaped linear conductors and the like, the present invention is not limited to such a configuration. The coil according to the present invention may include spiral shaped or substantially spiral shaped linear conductors each provided on different insulating base material layers. Alternatively, straight or substantially straight linear conductors each provided on different insulating base material layers may define a helical shaped coil of the present invention.

While each of the above described preferred embodiments of the present invention is an example in which the plane shape of the external connection electrodes P1 and P2 is a rectangle or substantially a rectangle, the present invention is not limited to such a configuration. The plane shape of the external connection electrodes P1 and P2 is able to be appropriately changed and may be a circle, an ellipse, a polygon, an L shape, a T shape, or a Y shape, for example.

Finally, the foregoing preferred embodiments are illustrative in all points and should not be construed to limit the present invention. It is to be understood that variations and modifications will be apparent to those skilled in the art without departing from the scope and spirit of the present invention. The scope of the present invention is defined not by the foregoing preferred embodiments but by the following claims. Further, the scope of the present invention is intended to include all possible changes and modifications from the preferred embodiments within the scopes of the claims and the scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:

a body including a plurality of insulating base material layers made of thermoplastic resin and stacked in a stacking direction;

a coil provided in contact with the stacked body and including a winding axis extending in the stacking direction of the plurality of insulating base material layers; and a first low flow member and a second low flow member provided in contact with the stacked body and including a flowability lower than a flowability of the thermoplastic resin at a temperature during heating and pressurizing of the thermoplastic resin; wherein;

the coil includes a plurality of linear or substantially linear conductors each of which is provided on different layers of the plurality of insulating base material layers, the coil including a first region surrounded by the plurality of linear conductors when viewed in the stacking direction;

the first low flow member and the second low flow member are each provided on one of the plurality of insulating base material layers; and at least a portion of the first low flow member and at least a portion of the second low flow member are arranged within the first region when viewed in the stacking direction;

the second low flow member includes a winding shape when viewed in the stacking direction; and the first low flow member, when viewed in the stacking direction, includes a planar or substantially planar shape and at least partially overlaps a second region surrounded by the second low flow member.

2. The multilayer substrate according to claim 1, wherein the first low flow member or the second low flow member and at least one of the plurality of linear conductors are provided on a same layer of the insulating base material layers.

3. The multilayer substrate according to claim 1, wherein the second low flow member includes a plurality of second low flow members.

4. The multilayer substrate according to claim 1, wherein the first low flow member includes a plurality of first low flow members.

5. The multilayer substrate according to claim 1, wherein the first low flow member and the second low flow member are made of a same material as a material of the plurality of linear conductors.

6. The multilayer substrate according to claim 4, wherein the first low flow member and the second low flow member are made of a same material as a material of the plurality of linear conductors; and the second low flow member is arranged to interpose the plurality of first low flow members in the stacking direction.

7. The multilayer substrate according to claim 1, further comprising a third low flow member and a fourth low flow member that are in contact with the stacked body and include a flowability lower than the flowability of the thermoplastic resin at the temperature during heating and pressurizing of the thermoplastic resin; wherein the third low flow member and the fourth low flow member are each provided on one of the plurality of insulating base material layers and, when viewed in the stacking direction, are arranged outside of the first region and at a position that does not overlap the plurality of linear conductors;

the fourth low flow member includes a winding shape when viewed in the stacking direction; and the third low flow member, when viewed in the stacking direction, includes a planar or substantially planar shape and at least partially overlaps a third region surrounded by the fourth low flow member.

8. The multilayer substrate according to claim 1, wherein none of the plurality of linear conductors are provided on the one layer of the plurality of base material layers that includes the second low flow member provided thereon.

9. The multilayer substrate according to claim 3, wherein the plurality of second low flow members are not connected to each other.

10. The multilayer substrate according to claim 3, wherein the plurality of second low flow members are connected to each other.

11. The multilayer substrate according to claim 1, wherein all of the second low flow members are provided on the one of the plurality of insulating base material layers.

12. The multilayer substrate according to claim 8, wherein the one layer of the plurality of base material layers that includes the second low flow member provided thereon is provided between two of the plurality of base material layers that include the plurality of linear conductors provided thereon.

13. The multilayer substrate according to claim 1, wherein the first low flow member and the second low flow member are provided on a same layer of the plurality of base material layers; and the first low flow member and the second low flow member at least partially overlap each other in the stacking direction.

14. The multilayer substrate according to claim 1, wherein the first low flow member is provided on an exterior surface of the stacked body.

15. The multilayer substrate according to claim 7, wherein the third low flow member is provided on an exterior surface of the stacked body.

16. The multilayer substrate according to claim 7, wherein the third low flow member includes a plurality of third low flow members; and the fourth low flow member interposes the plurality of third low flow members.

17. The multilayer substrate according to claim 7, wherein the third low flow member at least partially overlaps the fourth low flow member in the stacking direction.

18. The multilayer substrate according to claim 1, wherein a shape of the stacked body is rectangular parallelepiped, substantially rectangular parallelepiped, cubic, or substantially cubic.

19. The multilayer substrate according to claim 1, wherein the winding axis extends through a center portion of each of the first low flow member and the second low flow member.

20. The multilayer substrate according to claim 12, wherein the plurality of first low flow members are provided on exterior surfaces of the stacked body.

* * * * *